United States Patent
Liang et al.

(10) Patent No.: US 7,091,813 B2
(45) Date of Patent: Aug. 15, 2006

(54) INTEGRATED CIRCUIT TRANSFORMER FOR RADIO FREQUENCY APPLICATIONS

(75) Inventors: Tao Liang, Westford, MA (US); Xiaodong Wang, Acton, MA (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 10/167,484

(22) Filed: Jun. 13, 2002

(65) Prior Publication Data

US 2003/0231095 A1 Dec. 18, 2003

(51) Int. Cl.
*H01F 5/00* (2006.01)
(52) U.S. Cl. .................................... 336/200
(58) Field of Classification Search ............ 336/65, 336/83, 192, 200, 206–208, 232
See application file for complete search history.

(56) References Cited

U.S. PATENT DOCUMENTS

| | | | |
|---|---|---|---|
| 5,262,740 A | | 11/1993 | Willems |
| 5,497,137 A | | 3/1996 | Fujiki |
| 5,675,392 A | | 10/1997 | Nayebi et al. |
| 5,844,449 A | | 12/1998 | Abeno et al. |
| 5,852,866 A | * | 12/1998 | Kuettner et al. ............ 29/608 |
| 5,969,590 A | | 10/1999 | Gutierrez |
| 6,026,286 A | | 2/2000 | Long |
| 6,097,273 A | * | 8/2000 | Frye et al. ............ 336/200 |
| 6,133,806 A | | 10/2000 | Sheen |
| 6,137,376 A | | 10/2000 | Imbornone et al. |
| 6,396,362 B1 | * | 5/2002 | Mourant et al. ........... 333/25 |

FOREIGN PATENT DOCUMENTS

JP 06-13239 * 1/1994 .............. 336/200

OTHER PUBLICATIONS

Monolithic Transformers for Silicon RF IC Design, IEEE BCTM 6.1, Dickson T.S. Cheung et al. 1998, pp. 105-107.

* cited by examiner

*Primary Examiner*—Tuyen T. Nguyen
(74) *Attorney, Agent, or Firm*—Connolly, Bove, Lodge & Hutz LLP

(57) ABSTRACT

An integrated circuit transformer. A substrate supporting multiple layers of materials of an integrated circuit is provided with a first metallization layer comprising a first set of turns of a primary winding of a transformer, and a second set of turns of a secondary winding of the transformer. A insulation layer is deposited over the first metallization layer, and a second metallization layer bearing a second set of turns of the primary winding, and an optional third set of turns of a second secondary winding. A via connection connects one end of the first set of turns of the primary winding to the second turns of the primary winding located on the second metallization layer. The result is a transformer structure where the primary winding is provided on multiple layers and each secondary winding is confined to a single layer.

3 Claims, 6 Drawing Sheets

CONVENTIONAL BALUN TRANSFORMER $k=M/(L1 \times L2)^{1/2}$
$Zin=Zl \times (L1/L2)$

INTEGRATED CIRCUIT TRANSFORMER FOR RADIO FREQUENCY APPLICATIONS

BACKGROUND OF INVENTION

The present invention relates to microwave components used in radio and telephone communications. Specifically, an integrated circuit transformer is disclosed which can be used as a multi-winding balun transformer in radio frequency applications.

SiGe integrated technology has been used to manufacture integrated circuits to implement RF receivers as well as RF transmitters in wireless personal communications systems. Radio frequency signal circuits typically require inductances or transformers having multiple windings to perform standard radio frequency circuit functions. Wireless telephones, for instance, require receivers which have tuned circuit inductors and transformers in the first RF section, and have mixer circuits which use transformers for converting the received microwave signals into intermediate frequency signals. Compared to other passive circuit components, the integration of inductances and transformer elements for performing these functions is considerably more difficult in VLSI technology. Specifically, whereas micro-strip components may be used to create inductances and transformer windings, attempts to integrate them in VLSI technology has been limited by the high losses that substrate dielectrics present to a micro-strip component.

Attempts have been made to implement a transformer windings in multi-layer metallization surfaces separated by a silicon oxide insulation layer. These attempts, however, have been unsuccessful in controlling the high parasitic capacitance which occurs between windings on different metallization layers of a VLSI circuit. The high parasitic capacitance is especially troublesome when using a transformer in a differential mode application since the parasitic capacitance degrades common mode rejection which is desired in circuits which are intended to operate in a differential mode.

The present invention is directed to improvements in transformer designs for such VLSI applications.

SUMMARY OF THE INVENTION

An integrated circuit transformer is formed on a substrate having multiple metallization layers separated by an insulation layer. A primary winding of the transformer includes winding turns on each of two metallization layers separated by the insulation. A secondary windings for the transformer may be formed on either metallization layer, and each of the turns of the secondary winding are separated by a turn of the primary winding.

In one embodiment of the invention a balun transformer is provided. Secondary windings are included on both metallization layers bearing a portion of the primary winding. The transformer exhibits parasitic capacitance only between turns of the primary winding which are on different metallization layers, and not between turns of the primary and secondary winding which are on the same metallization layer, thus preserving the common mode rejection for the transformer.

DESCRIPTION OF THE PREFERRED EMBODIMENT

Figure 1A:
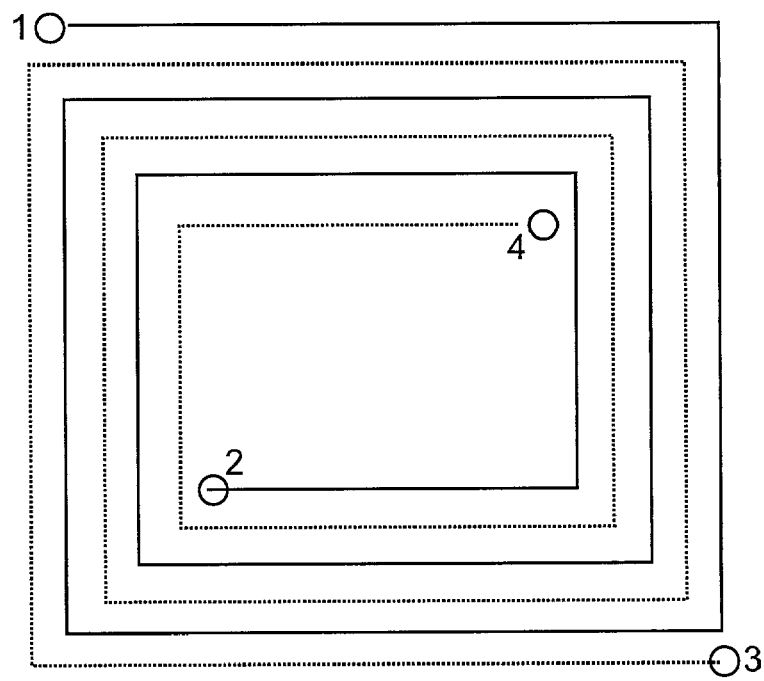
FIG. 1A is a conventional planar transformer of the prior art.
Figure 1B:
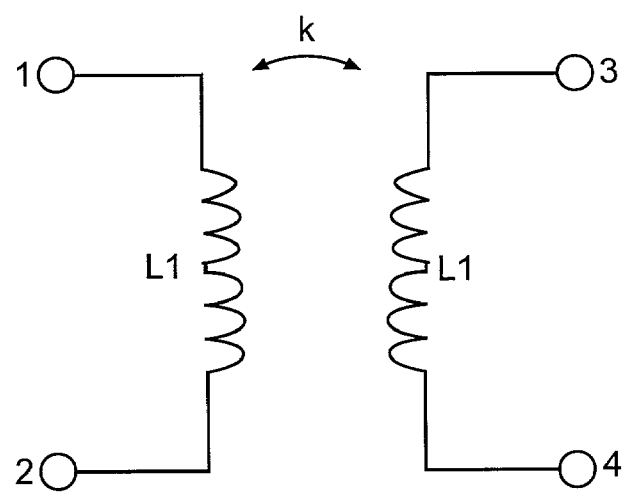
FIG. 1B is the lumped equivalent circuit for the transformer of FIG. 1A.

Referring now to FIGS. 1A and 1B, there is shown, respectively, a conventional balun transformer wherein a first primary winding 1–2 is co-planer with a secondary winding 3–4, and its lumped equivalent circuit. The resulting transformer has the known relationship defining mutual coupling K described as follows:

$$K=M/(L1 \times L2)^{1/2}$$

The impedance ZIN looking into the transformer primary winding 1–2 terminals is proportional to the load impedance ZL connected to the terminals of secondary winding 3–4 as:

$$ZIN=ZL \times (L1/L2)$$

Figure 2A:
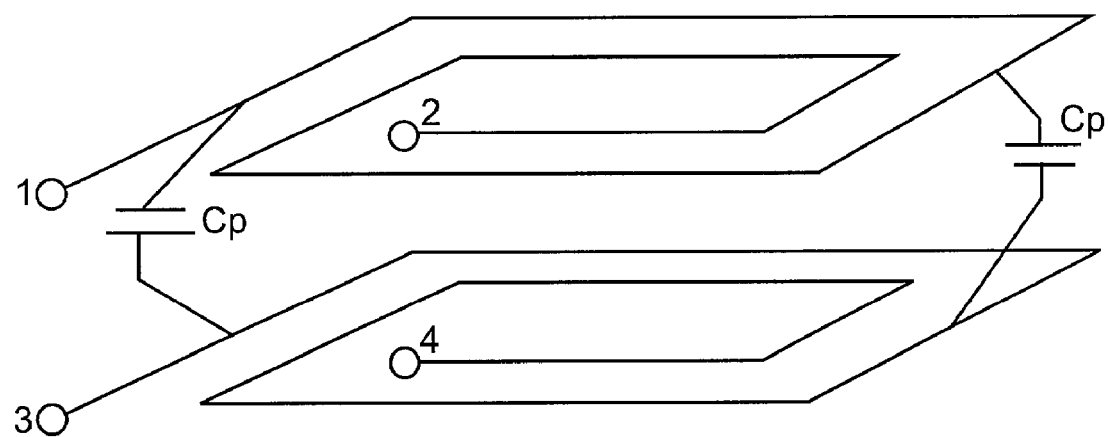
FIG. 2A illustrates the parasitic capacitance which degrades common mode rejection when primary and secondary windings are on different metallization layers of an integrated circuit.
Figure 2B:
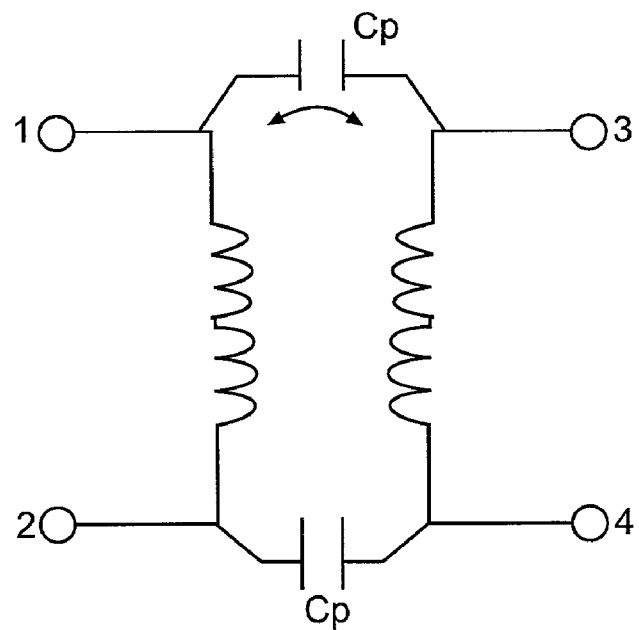
FIG. 2B illustrates the equivalent circuit for the transformer of FIG. 2A.

When the transformer is implemented in VLSI, it occupies significant substrate area. To reduce the substrate area occupied by the transformer, a stacked winding as shown in FIG. 2A has been attempted. The primary winding 1–2 and the secondary winding 3–4 exist on separate metallization layers of a substrate separated by a dielectric such as silicon oxide. In many applications for personal wireless communications systems, a balun transformer provides differential mode signal processing where high common mode rejection is desirable. The lumped equivalent circuit for the circuit of FIG. 2A is represented by FIG. 2B which illustrates the problem of parasitic capacitance Cp between primary windings 1–2 and secondary windings 3–4 which reduces the circuit Q for the device and degrades balun transformer common mode rejection.

Figure 3A:
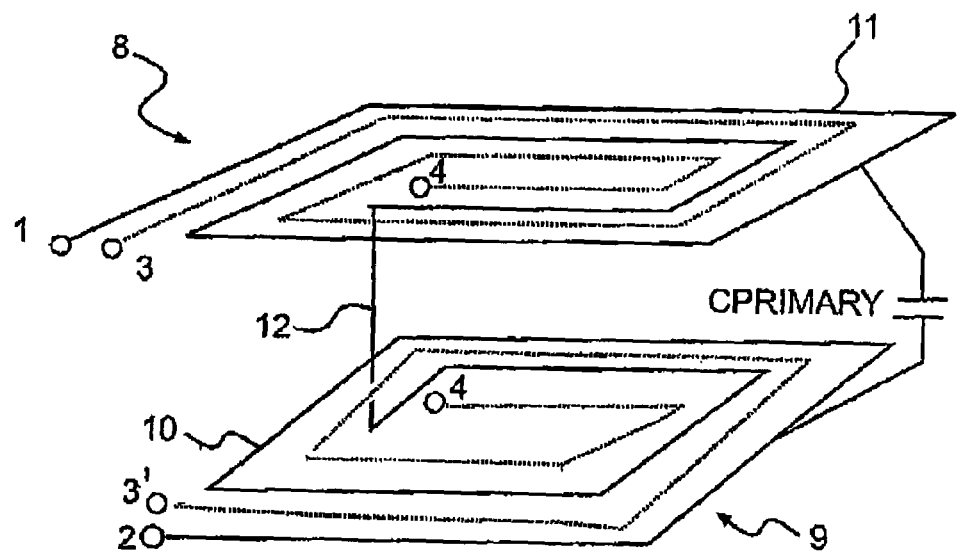
FIG. 3A is a schematic representation of a primary and secondary winding of a transformer in accordance with a first embodiment of the invention.
Figure 3B:
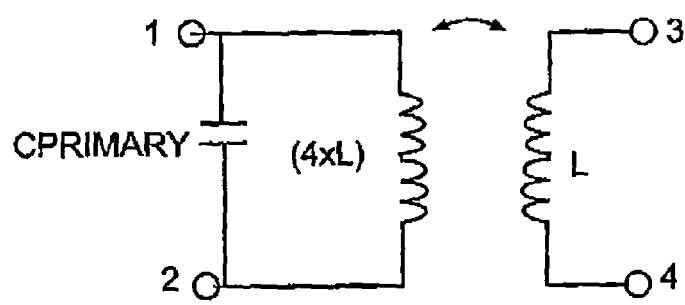
FIG. 3B illustrates the lumped equivalent circuit of the transformer of FIG. 3A.

The first embodiment of the invention is represented schematically in FIG. 3A, and its lumped constant equivalent circuit is shown in FIG. 3B. In accordance with the present invention, multiple metallization layers 8,9 are provided on a substrate for forming the turns of the primary winding 1–2 and a secondary winding 3–4. As shown in FIG. 3A, the primary winding 1–2 has first and second segments 10,11 occupying different metallization layers 8,9 of the VLSI circuit. The primary winding segments 10,11 are connected through a circuit via 12 in an insulating layer separating the metallization layers 8,9. A single secondary winding 3–4 is shown on one metallization layer 8 only, each turn of which is separated by a turn of the primary winding segment 11 on the same metallization layer 8 and coplanar therewith. As illustrated in the equivalent circuit of FIG. 3B, the parasitic capacitance Cp is confined to turns of different segments 10,11 of the primary winding 1–2, and does not occur between the primary winding 1–2 and secondary winding 3–4. Accordingly, improved common mode rejection results since the parasitic coupling between primary and secondary has been significantly reduced over that of FIG. 2A.

By providing one segment 11 of the primary winding 1–2 on one layer, and the second segment 10 on another layer 9, separated by a dielectric such as SiO2, it is possible for a given area of the substrate supporting the multiple layers to have a winding with increased inductance (or, conversely, using less substrate area to achieve the same inductance), since the inductance increases as the square of the number of turns. Accordingly, more turns for each winding are possible using the stacked structure according to FIG. 3A for a given surface area then that of FIG. 1A of the prior art where both primary 1–2 and secondary 3–4 windings have to be provided on a single layer.

Figure 4A:
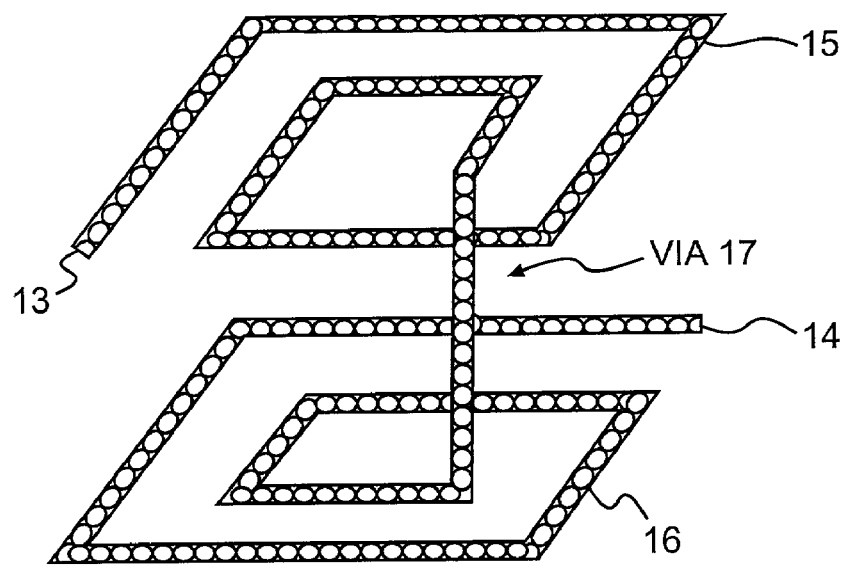
FIG. 4A illustrates the primary winding of a transformer in accordance with a second embodiment of the invention.
Figure 4B:
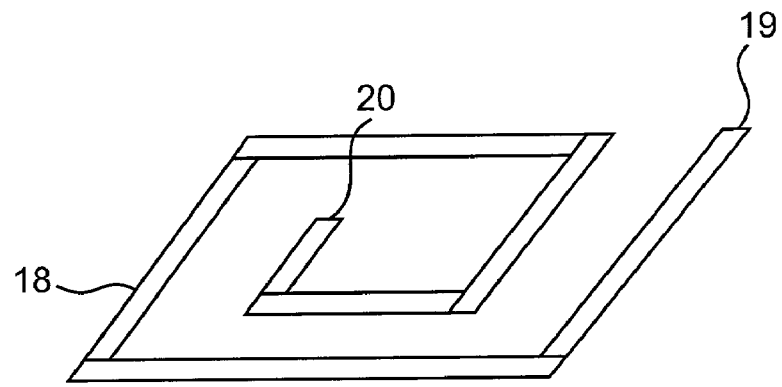
FIG. 4B illustrates secondary windings of a transformer in accordance with the second embodiment of the invention.
Figure 4B:
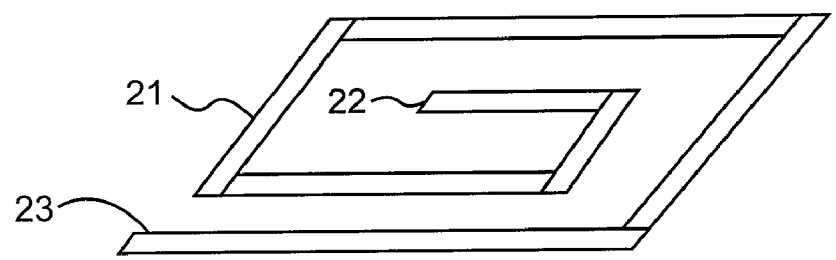
Figure 4C:
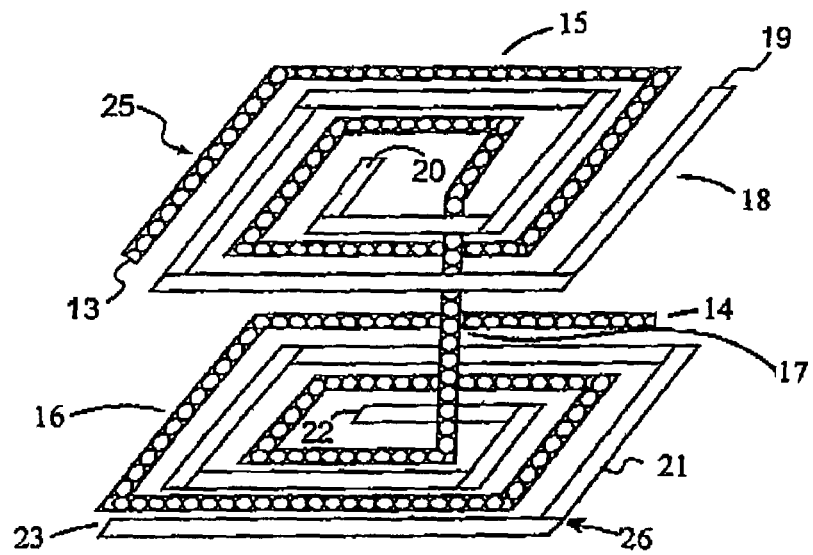
FIG. 4C illustrates a three dimensional representation of the primary winding and secondary windings of the second embodiment of the invention.

FIGS. 4A, 4B and 4C represent a particular type of compact multi-level transformer which is useful in applications such as a doubly balanced mixer. The primary winding shown in FIG. 4A has ends 13 and 14 which are connected to turns of different segments 15, 16 of the primary winding which are on different metallization layers. The segments are connected to each other through a via 17 constituting a vertically extending conductor. The secondary windings 18, 21 shown in FIG. 4B have ends 19, 20, 22 and 23 respectively. Each of the secondary windings 18, 21 is located on the different metallization layers 25, 26 of FIG. 4C, and are wound concentric with the segments 15, 16 of the primary windings on each of the metallization layers 25, 26. Each turn of the secondary windings 18, 21 is separated from an adjacent turn by a turn of the primary winding segment 15, 16 on the respective metallization layer 25, 26.

Figure 5D:
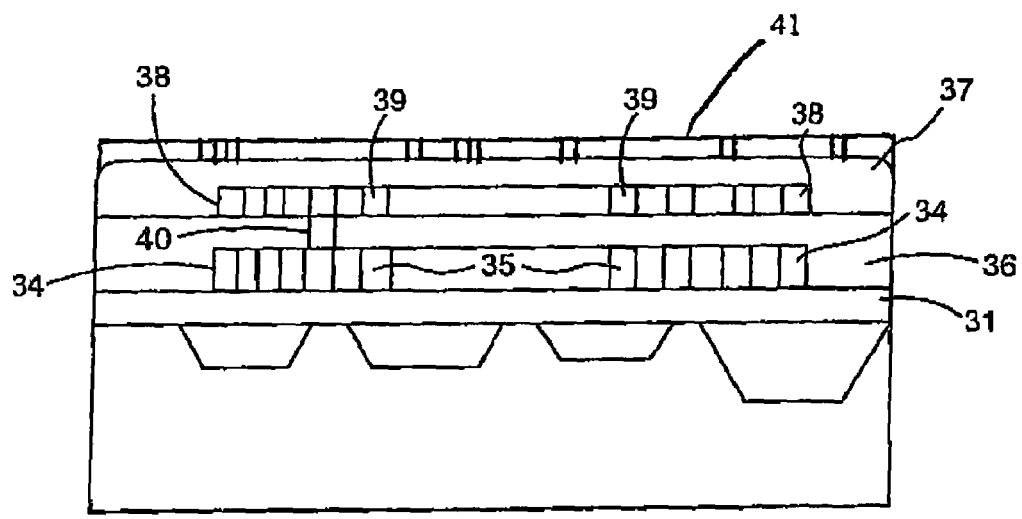
FIG. 5D illustrates the process of forming the second segment of the primary winding and the second secondary winding.
Figure 5A:
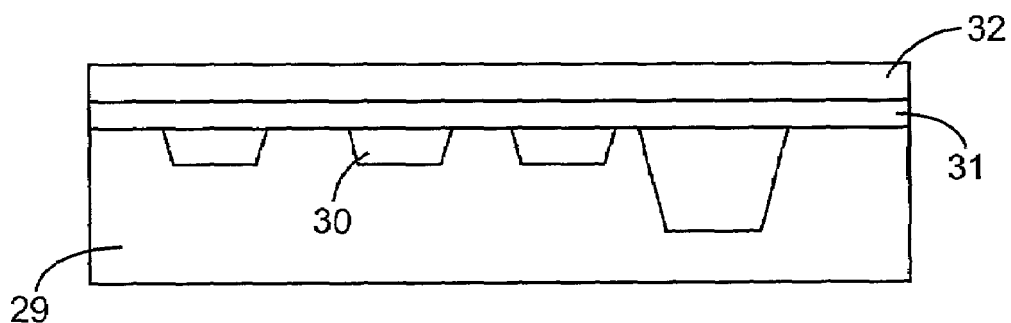
FIG. 5A illustrated the process step of forming a first metallization layer over semiconductor devices formed in a substrate.
Figure 5B:
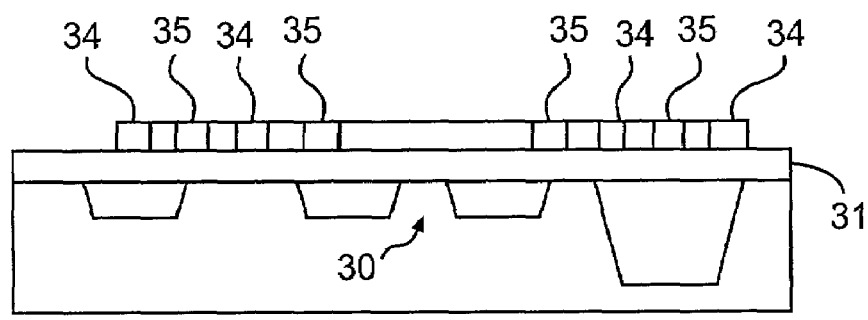
FIG. 5B illustrates the process of forming a first winding segment for a primary winding of the transformer with an interleaved secondary winding.
Figure 5C:
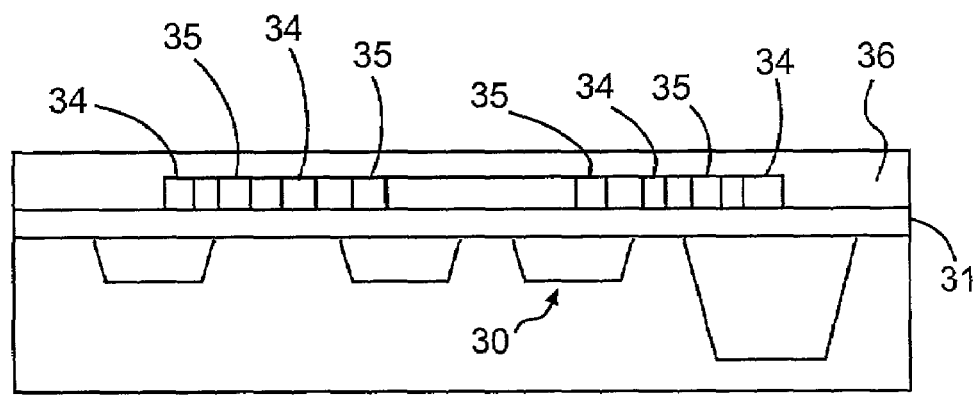
FIG. 5C illustrates the process of forming a second insulation layer over the first metallization layer for supporting a second primary winding segment and a second secondary winding.

Referring to FIG. 5A, the process of implementing transformers in accordance with the foregoing begins with a substrate 29 having silicon devices 30 which form the active circuit devices. Once the active circuit areas are formed, a silicon dioxide (SiO2) insulating layer 31 is applied to the active silicon area of the chip and the first metallization layer 32 is deposited on the insulating layer 31. Following the step of metallizing the insulation layer, the turns of a segment of the primary winding 34, along with the turns of a secondary winding 35 are formed as an interleaved pattern on the metallization layer using photolithography as shown in FIG. 5B. Once the secondary and primary windings 34, 35 have been patterned and etched in the interleaved pattern so that the turns of each winding are separated by turns of the other winding, a second insulation layer 36 is applied as shown in FIG. 5C. FIG. 5D shows a top metallization layer for forming the turns of the remaining segment of the primary winding 34 formed on the insulation layer 36. Using photolithography, the top primary winding segment 38 is patterned and etched along with the secondary winding 39 as was done with the previous metallization layer. A via 40 is formed through the insulation layer 36, and a vertical conductor is established to connect the ends of the primary winding segments 34,38 with a vertical conductor as shown.

A third metallization layer 41 may be formed over a subsequent insulation layer 37 to provide exit connections for the transformer winding ends.

Thus, there has been described with respect to the several embodiments of the invention, a multi-level transformer and process for making thereof. The foregoing description of the invention illustrates and describes the present invention. Additionally, the disclosure shows and describes only the preferred embodiments of the invention in the context of a voltage controlled oscillator, but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form or application disclosed herein. Also, it is intended that the appended claims be construed to include alternative embodiments.

What is claimed is:

1. An integrated circuit transformer comprising:
    a substrate for supporting multiple layers of an integrated circuit;
    a first metallization layer comprising a first set of turns of a primary winding of a transformer, and separated by a second set of turns of a first secondary winding of said transformer confined to said first metallization layer, each turn of said first secondary winding being separated by a winding of said first set of turns of said primary winding;
    a second metallization layer separated from said first metallization layer by an insulating layer, said second metallization layer comprising a second set of turns of said primary windings separated by turns of a second secondary winding confined to said second metallization layer; and
    a via connection connecting one end of said primary first set of turns to one end of said primary winding second turns, whereby a complete primary winding is provided using said first and second metallization layers, and said secondary windings are confined to said first and second metallization layers respectively.

2. The integrated circuit transformer according to claim 1 comprising a third metallization layer for connecting the ends of said windings to external connections of said integrated circuit.

3. The integrated circuit transformer according to claim 1 further comprising a set of turns forming a second secondary winding coplanar with, and separated by, said second set of turns of said primary winding and confined to said second metallization layer.

* * * * *